US007505341B2

(12) United States Patent
Kim et al.

(10) Patent No.: US 7,505,341 B2
(45) Date of Patent: Mar. 17, 2009

(54) LOW VOLTAGE SENSE AMPLIFIER AND SENSING METHOD

(75) Inventors: Tae Kim, Boise, ID (US); Charles L. Ingalls, Meridian, ID (US); David Pinney, Boise, ID (US); Howard Kirsch, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 350 days.

(21) Appl. No.: 11/436,863

(22) Filed: May 17, 2006

(65) Prior Publication Data

US 2007/0268764 A1 Nov. 22, 2007

(51) Int. Cl.
*G11C 7/00* (2006.01)

(52) U.S. Cl. .................. 365/205; 365/189.05; 365/226

(58) Field of Classification Search ................. 365/205, 365/189.05, 226
See application file for complete search history.

(56) References Cited

U.S. PATENT DOCUMENTS

| 4,851,720 | A | 7/1989 | Pathak et al. ................. 307/530 |
| 5,526,313 | A | 6/1996 | Etoh et al. ................... 365/205 |
| 5,526,322 | A | 6/1996 | Lee .......................... 365/233.5 |
| 5,579,274 | A | 11/1996 | Van Buskirk et al. ........ 365/208 |
| 5,661,691 | A | 8/1997 | Lin ............................ 365/208 |
| 5,698,998 | A | 12/1997 | Bodenstab .................... 327/55 |
| 5,729,493 | A | 3/1998 | Morton ................... 365/185.21 |
| 5,748,015 | A | 5/1998 | Tam ............................. 327/51 |
| 5,761,124 | A * | 6/1998 | Sato et al. .............. 365/185.22 |
| 5,821,799 | A | 10/1998 | Saripella ..................... 327/333 |
| 5,856,939 | A * | 1/1999 | Seyyedy ..................... 365/149 |
| 5,905,686 | A | 5/1999 | Raad .......................... 365/207 |
| 5,939,903 | A | 8/1999 | Lin ............................. 327/57 |
| 6,051,999 | A | 4/2000 | To et al. ....................... 327/66 |
| 6,225,833 | B1 | 5/2001 | Brown ......................... 327/52 |
| 6,466,059 | B1 | 10/2002 | Gaibotti et al. ............... 327/53 |
| 6,944,066 | B1 | 9/2005 | Jing ....................... 365/189.05 |
| 7,019,561 | B2 | 3/2006 | Morgan ........................ 327/51 |

OTHER PUBLICATIONS

Lee, K-C. et al., "Low Voltage High Speed Circuit Designs for Giga-bit DRAMs", 1996 Symposium on VLSI Circuits Digest of Technical Papers, Two pages.

* cited by examiner

*Primary Examiner*—Anh Phung
*Assistant Examiner*—Toan Le
(74) *Attorney, Agent, or Firm*—Dorsey & Whitney LLP

(57) ABSTRACT

Systems and methods of sensing a data state coupled to a digit line and for coupling a digit line to a sense amplifier. In sensing the data state coupled to the digit line, the digit line is coupled to a sense node and driving voltages provided to the sense amplifier. The data state is latched in response to the driving voltages. In coupling the digit line to a sense amplifier, the digit line is coupled to the sense amplifier for a first time period and decoupled from the sense amplifier for a second time period. The digit line is coupled to the sense amplifier at a controlled rate following the second time period.

37 Claims, 6 Drawing Sheets

LOW VOLTAGE SENSE AMPLIFIER AND SENSING METHOD

TECHNICAL FIELD

The invention relates to memory devices, and more particularly, to sense amplifiers used to sense differential voltages produced by memory cells in memory devices, such as dynamic random access memory ("DRAM") devices.

BACKGROUND OF THE INVENTION

In modern semiconductor memories, the desire to lower power consumption has resulted in a decrease in the magnitude of a supply voltage VCC which provides power to the memories. Electronic systems typically benefit from lower power consumption, particularly portable systems which are battery powered. When the supply voltage VCC decreases, reference voltage circuitry in the memory that develops reference voltages which are a function of the supply voltage accordingly develop reference voltages having different values. For example, in many semiconductor memories digit lines are biased and equilibrated to a voltage equal to the supply voltage VCC divided by two. In this situation, a change in the supply voltage from 5 volts to 3.3 volts results in the reference voltage changing from 2.5 volts to 1.65 volts. Such a decrease in the reference voltage may affect the circuitry in the memory during operation.

One type of circuit that may be affected by a decrease in the bias voltage is a sense amplifier circuit. In a typical dynamic random access memory ("DRAM"), a sense amplifier circuit senses data stored in a memory cell by sensing a voltage differential between a pair of complementary digit lines associated with the memory cell, as known in the art. The sense amplifier circuit senses the voltage differential and drives the digit line at the higher voltage to approximately the supply voltage VCC and the digit line at the lower voltage to approximately zero volts. Typically, the sense amplifier circuit includes NMOS and PMOS transistors coupled between the digit lines. When the supply voltage VCC decreases, the threshold voltages VT of these transistors may prevent the sense amplifier circuit from driving the digit lines to the desired voltages as will be explained in more detail below.

FIG. 1 is a block diagram and simplified schematic of a conventional sense amplifier 12 having an open digit line configuration. The sense amplifier 12 senses data stored in memory cells (not shown) of cell arrays 2A, 2B that are coupled to complementary digit lines D, D_, respectively. As known, the cell arrays 2A, 2B typically include several digit lines D, D_ with each pair of digit line coupled to a respective sense amplifier. FIG. 1 illustrates only one of the sense amplifiers in order to simplify the following description. Binary data are stored in the memory cells utilizing a respective storage capacitor. The capacitor can be charged or can be left uncharged to store two types of data. When accessing a particular memory cell, the respective storage capacitor is coupled to a corresponding digit line. Prior to coupling the memory cell to the digit line, the digit line and a complementary digit line, both of which are coupled to a corresponding sense amplifier, are precharged to a voltage, typically VCC/2. In response to coupling the memory cell to the digit line, the stored charge or lack of charge causes a change in the voltage of digit line, which is detected by the sense amplifier coupled to the digit line. Based on the differential voltage between the digit line to which the memory cell is coupled and the complementary digit line, the sense amplifier amplifies and latches the data. The sense amplifier 12 includes PMOS transistors 20, 22 and NMOS transistors 24, 26 which are cross coupled to form PMOS and NMOS latches. The digit line D is coupled to a sense node 28 through an isolation transistor 6A and the digit line D_ is coupled to a sense node 30 through an isolation transistor 6B. An isolation switch driver circuit 10 provides ISOA, ISOB signals that control the isolation transistors 6A, 6B, respectively.

Operation of the sense amplifier will be described with reference to the timing diagram of FIG. 2. In the following example, it is assumed that the memory cell to be accessed is storing charge and is located in cell array 2A. Prior to time T0, a precharge circuit (not shown) sets the voltage of the digit lines D, D_ to VCC/2. At time T0, the ISOA, ISOB signals are driven to a pumped supply voltage VCCP that is greater than the VCC voltage. The ISOA, ISOB signals switch ON isolation transistors 6A, 6B to couple the digit lines D, D_ to the respective sense nodes 28, 30. At time T1, a word line (not shown) becomes active to couple the memory cell to the corresponding digit line D. As a result, the voltage of the digit line D is slightly increased. At a time T2, ACT and RNL_ signals become active, providing VCC to the sources of the PMOS transistors 20, 22 and ground to the sources of the NMOS transistors 24, 26. In response to the ACT and RNL_ signals, the sense amplifier 12 is activated and drives the digit line D to VCC and drives the digit line D_ to ground. In this state, the sense amplifier 12 has sensed and latched data.

As previously discussed, operation of conventional sense amplifiers can be affected by decreased VCC voltage. One effect is that the lower VCC/2 voltage to which the digit lines D, D_ are precharged approaches the VT of the NMOS transistors 24, 26. Consequently, when the ACT and RNL_ signals become active, the sensing operation can take longer because the NMOS transistors 24, 26 do not switch ON as quickly, waiting for the positive feedback of the PMOS latch to provide sufficient voltage to fully switch ON the NMOS transistors 24, 26. The NMOS transistors 24, 26 can be designed to have lower VTs to accommodate a lower VCC voltage. However, lowering the VT also reduces the resistance of the sense amplifier 12 to erroneous latching due to electrical noise which may be coupled through the digit lines D, D_ to the sense amplifier 12.

Therefore, there is a need for a sense amplifier and/or sensing scheme that can be used to quickly and reliably sense data stored in memory cells in a semiconductor memory having reduced supply voltage.

SUMMARY OF THE INVENTION

In one aspect of the invention, a sense amplifier circuit includes a latch circuit, and first and second voltage supply circuits. The latch circuit is coupled to a digit line and is configured to latch a data state coupled to the digit line and further configured to generate differential data signals in response to the data state. The differential data signals have first and second voltages. The first voltage supply circuit is coupled to the latch circuit and is configured to provide a positive voltage as the first voltage. The second voltage supply circuit is coupled to the latch circuit and is configured to provide a negative voltage as the second voltage. In another aspect of the invention, the first voltage supply is coupled to the latch circuit and is configured to provide a voltage greater than a device supply voltage as the first voltage and the second voltage supply is configured to provide the second voltage.

In another aspect of the invention, a sense amplifier circuit includes a latch circuit, a coupling circuit, and a control circuit. The latch circuit has a node and is configured to latch a data state coupled to the node and is further configured to generate differential data signals in response to the data state. The coupling circuit is coupled to the node of the latch and to a digit line to which data states are coupled. The coupling circuit is configured to couple the digit line to the node of the latch responsive a control signal. The control circuit is coupled to the coupling circuit and is configured to control the coupling circuit to couple the digit line to the node and decouple the digit line and the node during a first phase. The control circuit is further configured to control the coupling circuit to couple the digit line to the node during a second phase subsequent to the first phase. The digit line and the node are coupled at a controlled rate during the second phase.

In another aspect of the invention a method of sensing a data state coupled to a digit line is provided. The method includes coupling the digit line to a sense node and providing a negative voltage. The data state is latched in response to the negative voltage. In another aspect of the invention a method of coupling a digit line to a sense amplifier is provided. The method includes coupling the digit line to the sense amplifier for a first time period and decoupling the digit line from the sense amplifier for a second time period. The digit line is coupled to the sense amplifier at a controlled rate following the second time period.

DETAILED DESCRIPTION OF PREFERRED EMBODIMENTS

Certain details are set forth below to provide a sufficient understanding of the invention. However, it will be clear to one skilled in the art that the invention may be practiced without these particular details. Moreover, the particular embodiments of the present invention described herein are provided by way of example and should not be used to limit the scope of the invention to these particular embodiments. In other instances, well-known circuits, control signals, and timing protocols.

Figure 2:
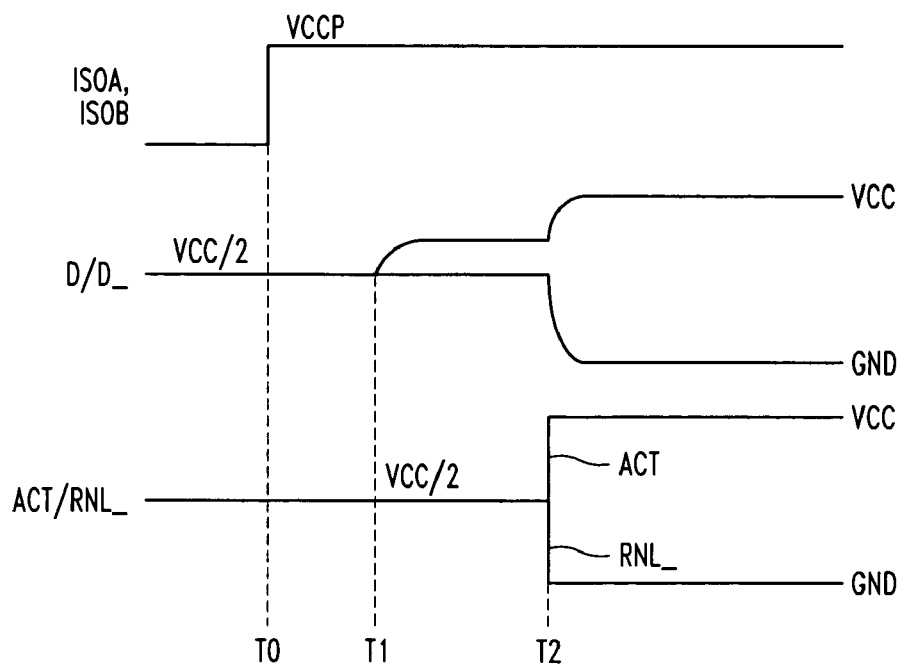
FIG. 2 is a timing diagram of various signals during operation of the sense amplifier of FIG. 1.
Figure 3:
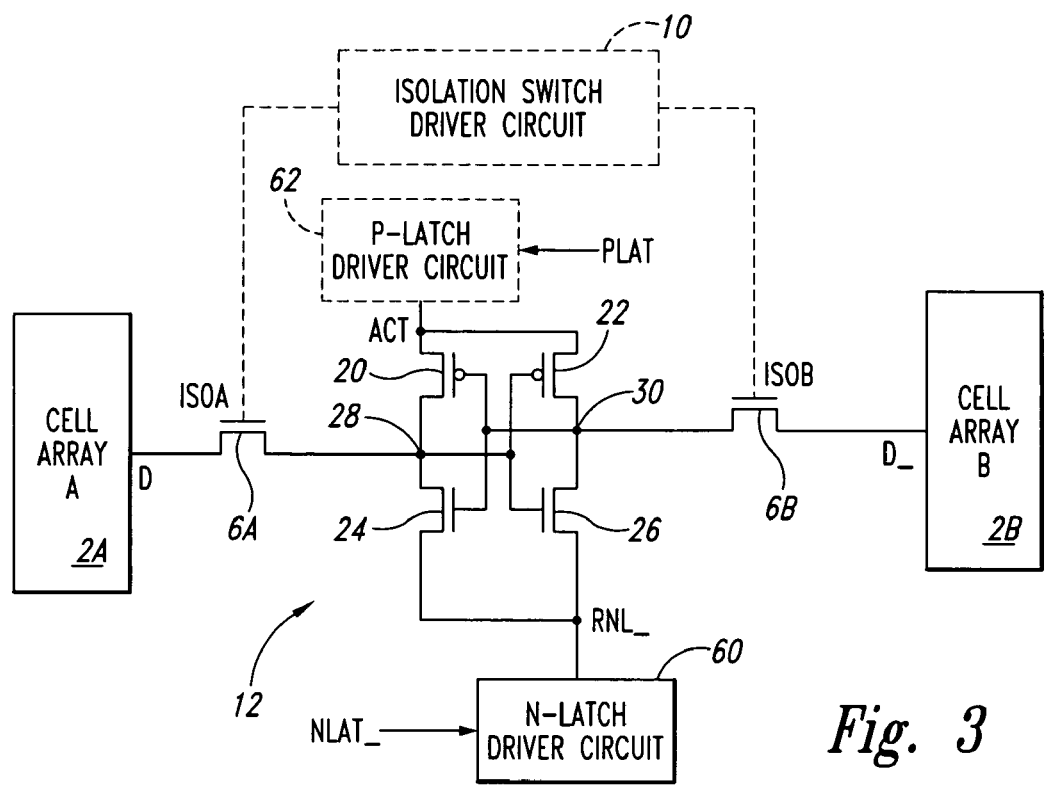
FIG. 3 is a block diagram and simplified schematic diagram of a open digit line sense amplifier configuration including an N-latch driver circuit according to an embodiment of the present invention.

FIG. 3 illustrates the sense amplifier 12 having an N-latch driver circuit 60 according to an embodiment of the present invention. As previously described with reference to FIG. 2, the sense amplifier 12 senses and amplifies the voltages of the digit lines D, D_ in response to the ACT and RNL_ signals becoming active. The ACT and RNL_ signals are typically half of the VCC voltage until becoming active, at which time the active ACT signal switches to the VCC voltage and the active RNL_ signal switches to a negative voltage or initially ground and then to a negative voltage, as will be described in more detail below. As also previously discussed, as using lower VCC voltages becomes more desirable, this presents the challenge of having a precharge voltage for the digit lines D, D_ that is sufficient to quickly switch ON the NMOS transistors 24, 26 during a sense operation.

The N-latch driver circuit 60 is coupled to the sources of the NMOS transistors 24, 26 to provide an NMOS sense signal RNL_ having a voltage that is less than ground (i.e., 0 volts). Providing a RNL_ signal having a negative voltage increases the gate-source voltage across the NMOS transistors 24, 26 during a sense operation, relative to the conventional NLAT_ signal that is at ground. As a result, the NMOS transistors 24, 26 can be switched ON more quickly. A P-latch driver circuit 62 is also illustrated in FIG. 3. The P-latch driver circuit 62 can be optionally included in addition or alternatively to the N-latch driver circuit 60. The P-latch driver circuit 62 is coupled to the sources of the PMOS transistors 20, 22 to provide an active PMOS sense signal ACT in response to a PLAT signal. The ACT signal provided by the P-latch driver 62 is greater than the VCC voltage for at least some time period following the beginning of the sense operation to increase the gate-source voltage across the PMOS transistors 20, 22 compared to applying VCC. As a result, the PMOS transistors 20, 22 can be switched ON more quickly when using lower operating voltages. Embodiments of the N-latch driver circuit 60 will be described in greater detail below. It will be appreciated that those ordinarily skilled in the art will obtain sufficient understanding from the description provided herein to apply some or all of the principles to embodiments of the P-latch driver circuit 62. Consequently, in the interest of brevity, a more detailed description of the P-latch driver circuit 62 is not provided.

Figure 4A:
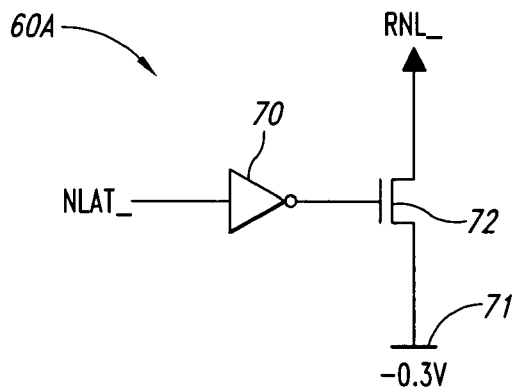
FIGS. 4A and 4B are schematic diagrams of N-latch driver circuits according to various embodiments of the present invention.

FIG. 4A illustrates an N-latch driver circuit 60A according to an embodiment of the present invention. The N-latch driver circuit 60A includes an inverter 70 and an NMOS transistor 72 having a source coupled to a negative voltage supply 71, shown in FIG. 4A as a −0.3V voltage supply. The RNL_ signal is provided at the drain of the NMOS transistor 72. Operation of the N-latch driver circuit 60A and the sense amplifier 12 is similar to that previously described with respect to the timing diagram of FIG. 2. In response to the NLAT_ signal becoming LOW at time T2 (FIG. 2), the output of the inverter 70 switches to a HIGH level to switch ON the NMOS transistor 72, thereby coupling the negative voltage supply 71 to the output of the N-latch driver circuit 60A. The negative voltage is applied to the sources of the NMOS transistors 24, 26 of the sense amplifier 12. As previously discussed, the negative voltage of the RNL_ signal enhances the gate-source voltage across the NMOS transistors 24, 26 to assist in switching ON the appropriate NMOS transistor 24, 26 during the sensing operation.

Figure 4B:
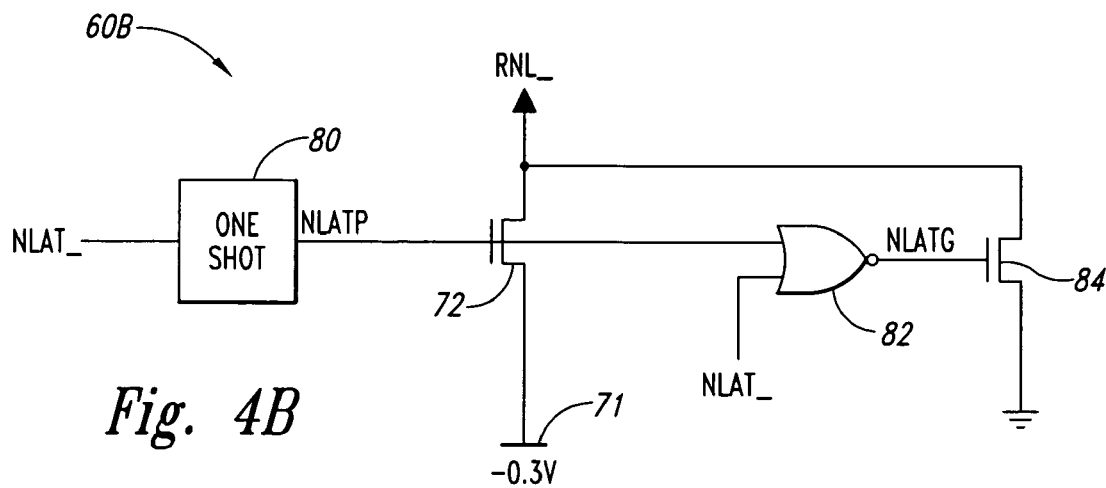

FIG. 4B illustrates an N-latch driver circuit 60B according to another embodiment of the present invention. The output of the N-latch driver circuit 60B is coupled to a negative voltage supply 71 through an NMOS transistor 72, and further coupled to ground through an NMOS transistor 84. The gate of the NMOS transistor 72 is coupled to an output of a one-shot circuit 80 that generates a NLATP signal that has positive pulse in response to the NLAT_ signal becoming LOW. The NLATP signal is also provided to a NOR gate 82 which has another input coupled to receive the NLAT_ signal. The output of the NOR gate 82 is coupled to the gate of the NMOS transistor 84.

Figure 5:
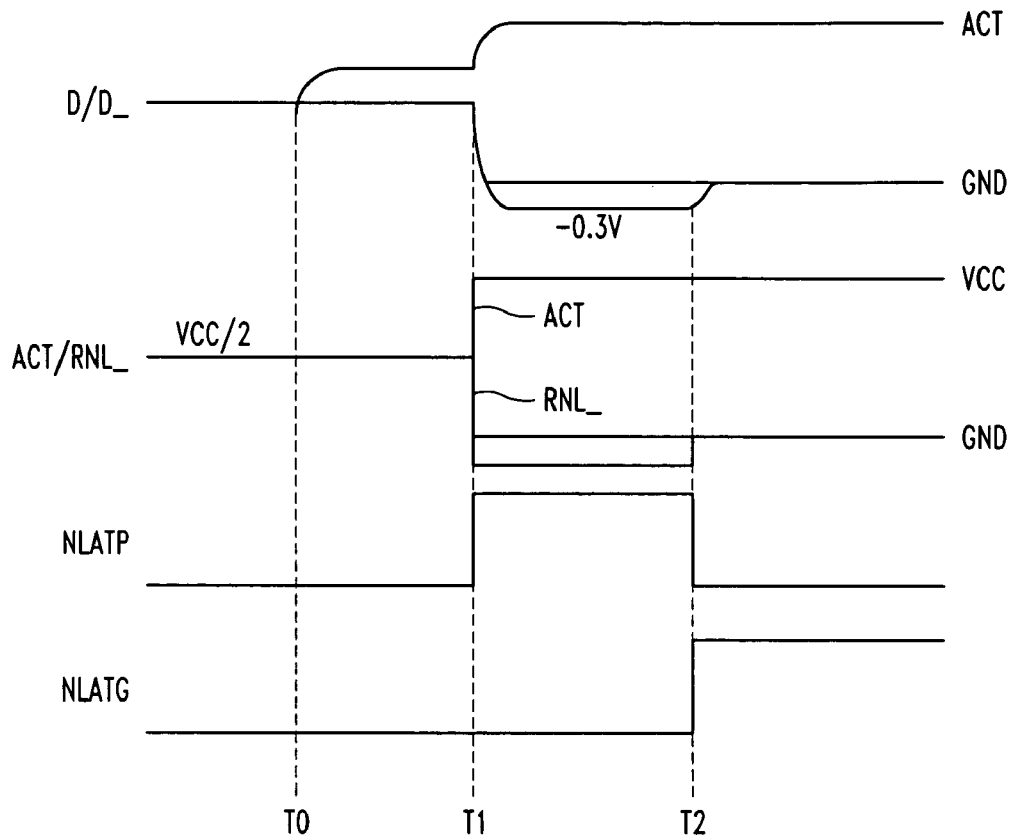
FIG. 5 is a timing diagram of various signals during operation of the N-latch driver according to an embodiment of the present invention.

Operation of the N-latch driver circuit 60B will be described with reference to the timing diagram of FIG. 5. At time T0, a word line (not shown) is activated to couple a memory cell to the respective digit line. The word line corresponds to the row of memory in which the memory cell to be accessed is located. When the word line is activated, the memory cell to be accessed is coupled to a corresponding digit line D. In the present example it will be assumed that a memory cell in the cell array 2A that is storing charge has been coupled to the digit line D in response to the activated word line. As shown in FIG. 5, the coupling of the memory cell causes the voltage of the digit line D to increase. The NLATP and NLATG signals remain LOW because the RNL_ signal is at VCC/2.

At time T1, the ACT and RNL_ signals become HIGH and LOW, respectively. In response to the RNL_ signal becoming LOW, the one shot circuit 80 generates a positive pulse in the NLATP signal. The NMOS transistor 72 is switched ON in response to the pulse of the NLATP signal and couples the output of the N-latch driver circuit 60B to the negative voltage supply 71. The NMOS transistor 84 remains OFF because the NLAT_ signal is LOW and the NLATP signal is HIGH causing the NOR gate 82 to continue to output a LOW NLATG signal. With the sources of the NMOS transistors 24, 26 of the sense amplifier 12 coupled to the negative voltage supply 71, there is sufficient gate-source voltage to quickly sense the voltages of the digit lines D, D_ and latch data. In the present example, the digit line D driven to the voltage of the ACT signal and the digit line D_ driven to the negative voltage of the negative voltage supply 71.

At time T2, the duration of the positive pulse ends and the NLATP signal becomes LOW, switching OFF the NMOS transistor 72 and decoupling the output of the N-latch driver circuit 60B from the negative voltage supply 71. With both the NLATP and NLAT_ signals LOW, however, the NLATG signal output by the NOR gate 82 becomes HIGH to switch ON the NMOS transistor 84 and couple the output of the N-latch driver circuit 60B to ground. The result is the voltage of the RNL_ signal changes from the negative supply voltage to ground, and consequently, the voltage of the digit line coupled to the output of the N-latch increases to ground as well.

Figure 6:
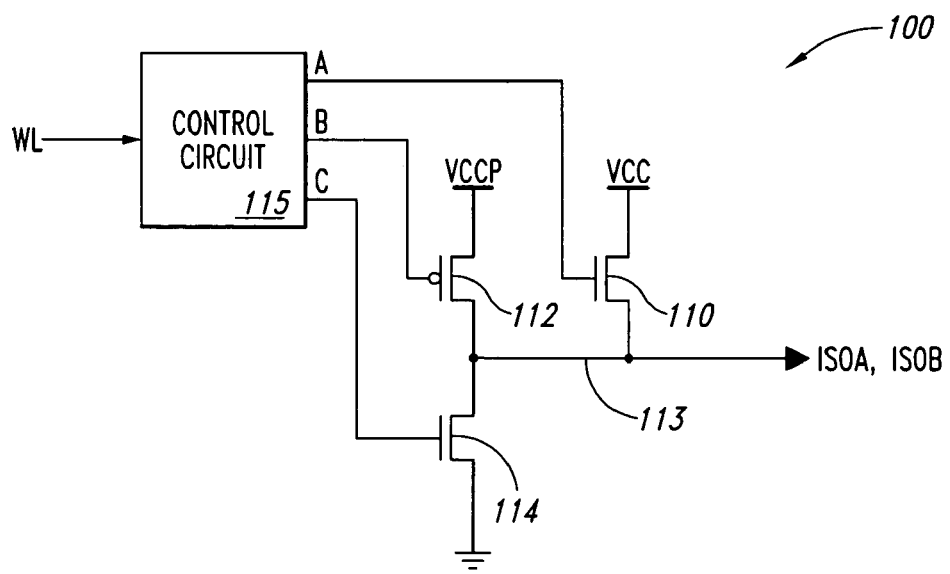
FIG. 6 is a schematic diagram of an isolation switch driver circuit according to an embodiment of the present invention that can be used in the sense amplifier configuration shown in FIG. 3.
Figure 7:
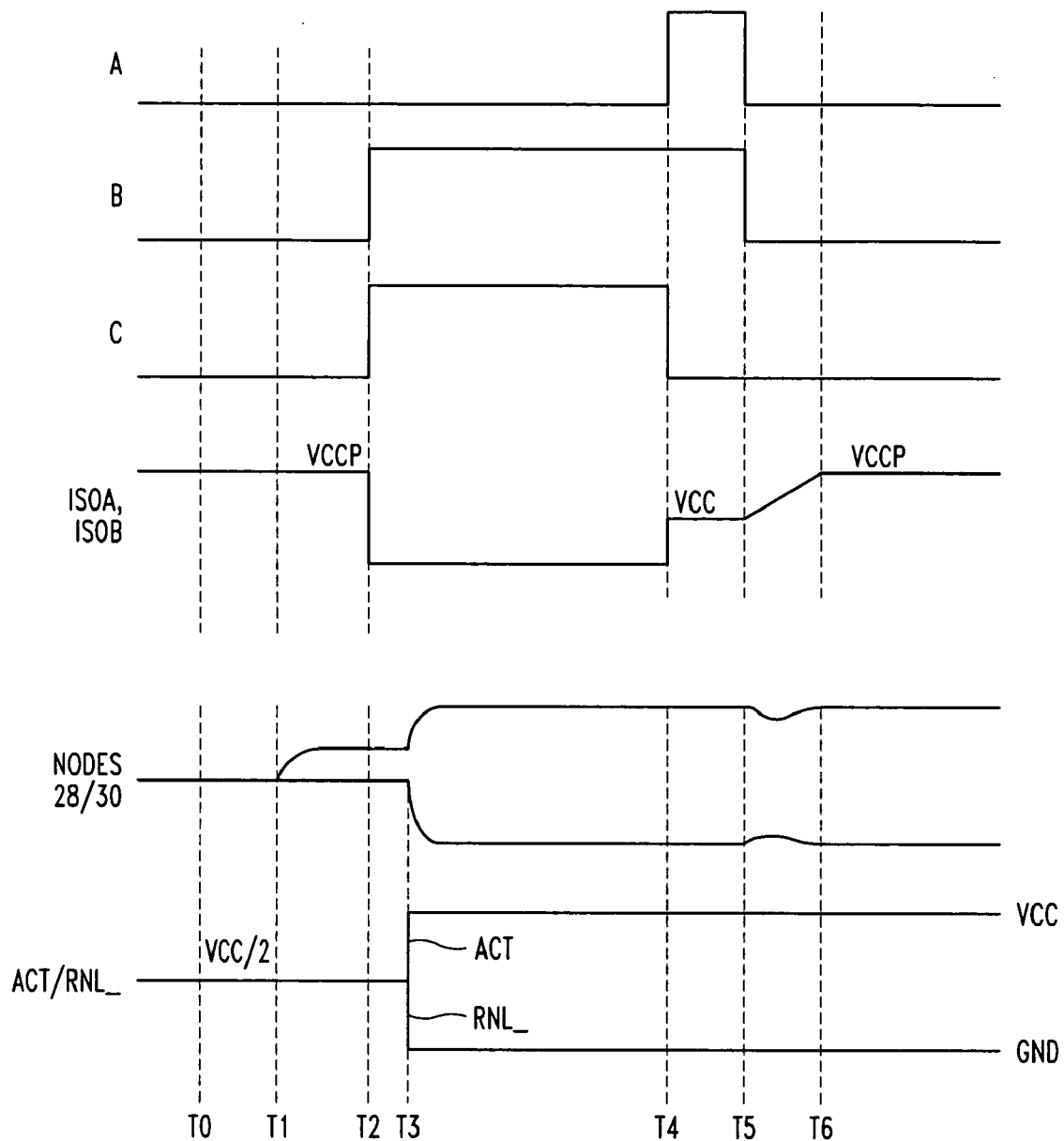
FIG. 7 is a timing diagram of various signals during operation of the isolation switch driver circuit of FIG. 6.

FIG. 6 illustrates an isolation switch driver circuit 100 according to an embodiment of the present invention. The isolation switch driver circuit 100 can be substituted for the conventional isolation switch driver circuit 10 shown in FIGS. 1 and 3. The isolation switch driver circuit 100 includes first and second NMOS transistors 110 and 114 coupled in series between a power supply VCC and ground. The ISOA and ISOB signals are provided at a node 113. The isolation switch driver circuit 100 further includes a PMOS transistor 112 coupled to a boosted power supply VCCP and the node 113. The voltage of the VCCP supply is greater than the voltage of the VCC supply. The gate of each transistor 110, 112, 114 is coupled to receive a respective control signal A, B, C. As will be described in more detail below, the A, B, C signals are generated by a control circuit 115 further included in the isolation switch driver circuit 100. In response to an active word line signal WL, the control circuit 115 generates A, B, C signals as illustrated in FIG. 7. Those ordinarily skilled in the art will obtain sufficient understanding of the control circuit 115 from the description provided herein to practice the invention.

Figure 1:
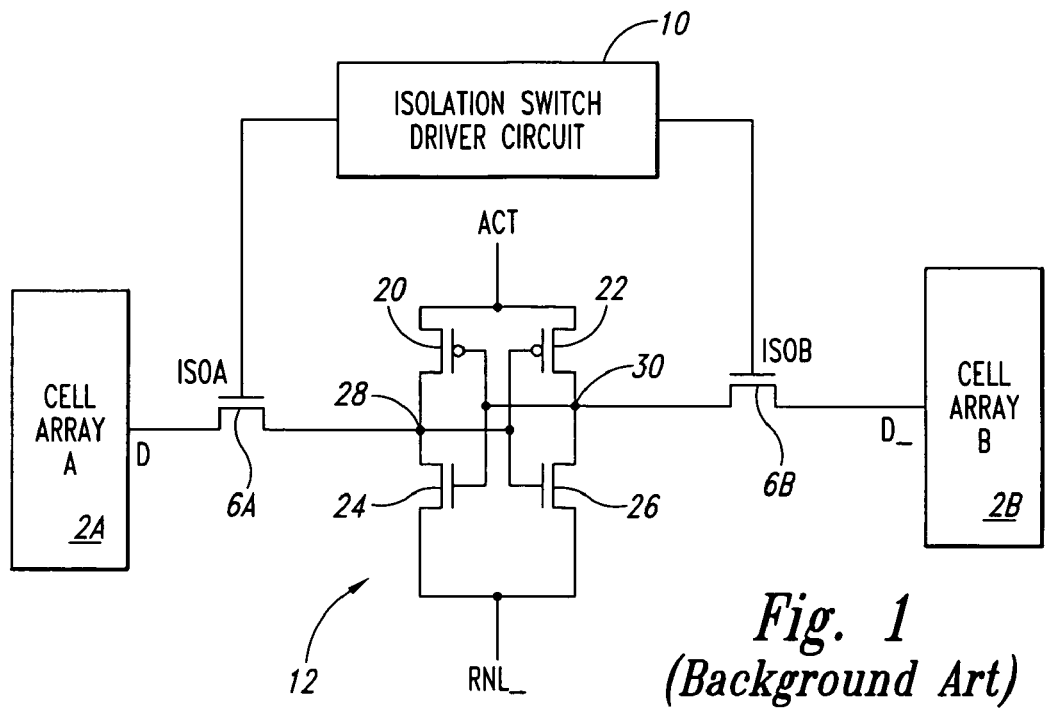
FIG. 1 is a block diagram and simplified schematic diagram of a conventional open digit line sense amplifier configuration.

FIG. 7 is a timing diagram of various signals during operation of the isolation switch driver circuit 100. At time T0, the B, C signals are LOW so that the PMOS transistor 112 is ON and the NMOS transistor 114 is OFF. As a result, the node 113 is coupled to the VCCP supply at time T0 to provide ISOA, ISOB signals that switch ON the isolation transistors 6A, 6B (FIG. 1). For the present example, it will be assumed that a memory cell storing charge and located in cell array 2A is to be accessed. At time T1, a word line (not shown) of cell array 2A is activated. As a result, the digit line D and the corresponding node 28 exhibit an increase in potential. The complementary digit line D_ and the corresponding node 30 remains at the digit line precharge level of VCC/2.

At time T2, the B and C signals are switched to HIGH levels to decouple the node 113 from the VCCP supply and couple the node 113 to ground. In response, the ISOA, ISOB signals switch LOW to switch OFF the isolation transistors 6A, 6B to isolate the digit lines D, D_ from the respective sense nodes 28, 30. The increase in potential due to the digit line D being coupled to the memory cell remains present at the corresponding sense node 28. At time T3, the ACT and RNL_ signals become active and the change in potential at the sense node 28 is amplified by the sense amplifier 12, as previously described. Consequently, during the time following T3, the nodes 28, 30 are driven to the respective voltages ACT and RNL_. Decoupling the nodes 28, 30 from the digit lines D, D_ prior to the ACT and RNL_ signals becoming active reduces the initial sensing current and also isolates the sense amplifier 12 from the digit line capacitance of digit lines D, D_. Additionally, decoupling the nodes 28, 30 from the digit lines D, D_ during the sensing operation also isolates the sense amplifier 12 from any noise or disturbance in the respective cell arrays 2A, 2B that may interfere with the sensing operation.

At time T4, the C signal is brought LOW to decouple the node 113 from ground and the A signal is brought HIGH to activate the transistor 110 and couple the node 113 to the VCC supply. In response, the ISOA, ISOB signals are driven to the VCC voltage. At time T5, both the A and B signals are brought LOW causing the node 113 to be coupled to the VCCP supply. The node 113 is pulled to the VCCP voltage between time T5 and T6 in an increasing manner to control the rate at which the isolation transistors 6A, 6B are switched ON in response to the ISOA, ISOB signals. As a result, electrical disturbance to the nodes 28 and 30 (FIG. 3) can result from recoupling the digit lines D, D_ to the nodes 28, 30 is reduced. The changes in the voltages of nodes 28, 30 shown in FIG. 7 between times T5 and T6 illustrate the reduced electrical disturbance that results from controlling the rate at which the ISOA, ISOB signals increase and the manner in which the isolation transistors 106A, 106B are switched ON. The rate at which the ISOA, ISOB signals increase can be controlled by tailoring parameters of the PMOS transistor 112. For example, adjusting the channel width and the VT of the PMOS transistor 112 can be used for this purpose.

In an alternative embodiment, an N-latch driver circuit according to an embodiment of the present invention can be combined with an isolation switch driver circuit according to an embodiment of the present invention. For example, the N-latch driver circuit 60B of FIG. 4B can be combined with the isolation switch driver circuit 100 of FIG. 6. With reference to the timing diagram of FIG. 5, times T0, T1 and T2 can correspond to times T1, T3, and T4, respectively, of the timing diagram of FIG. 7. In such an embodiment, the voltage of the RNL_ signal is switched from a negative voltage to ground prior to the time the isolation transistors 6A, 6B are switched ON. As a result, current consumption in response to recoupling the digit lines D, D_ to the nodes 28, 30 is relative to ground instead of a negative voltage, thereby reducing the current consumption.

Figure 8:
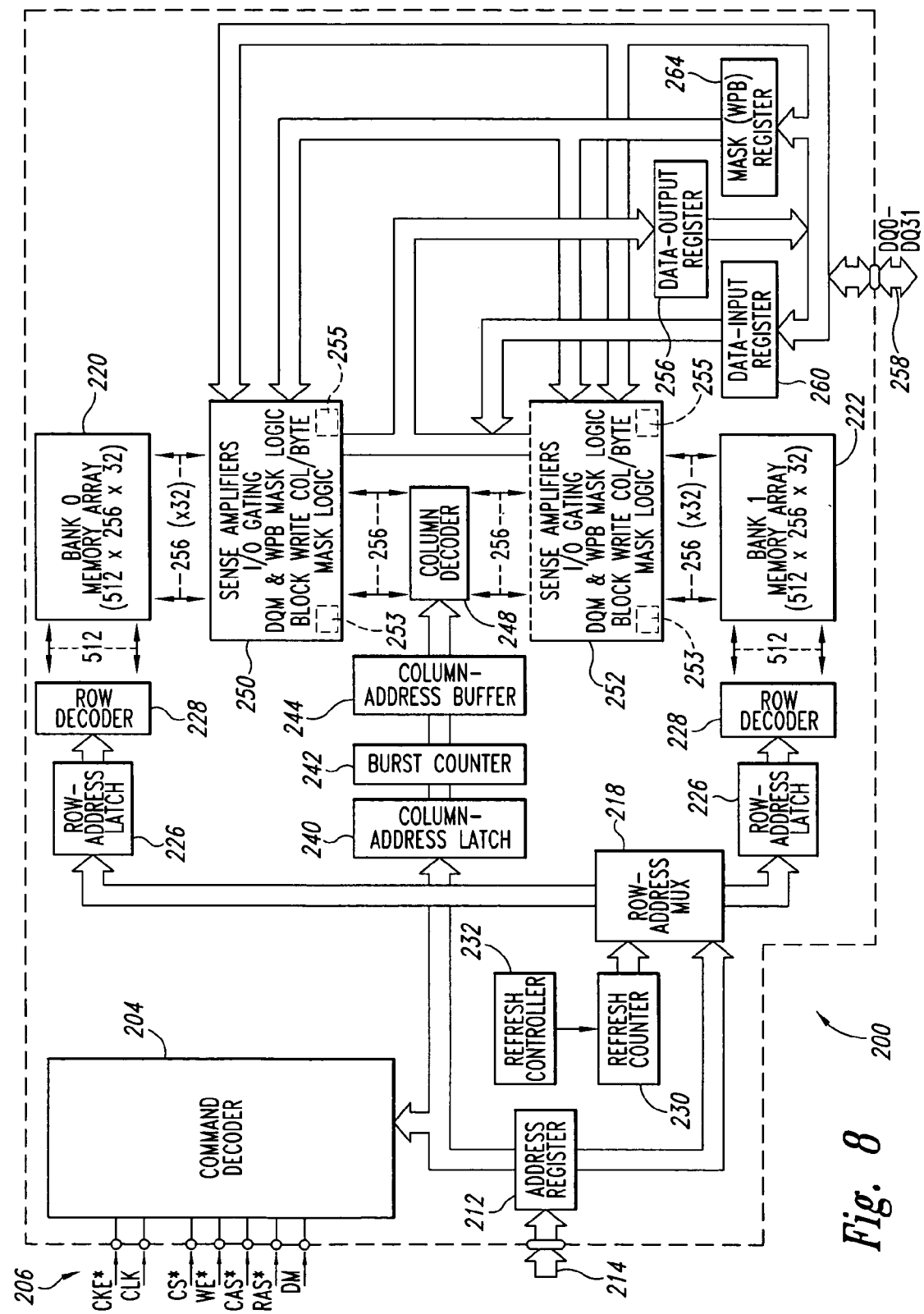
FIG. 8 is a block diagram of a memory device having an N-latch driver circuit and/or an isolation switch driver circuit according to embodiments of the present invention.

FIG. 8 is a block diagram of a conventional synchronous dynamic random access memory ("SDRAM") 200 that utilizes an N-latch driver circuit according to an embodiment of the present invention and/or an isolation switch driver circuit according to an embodiment of the present invention. Of course, the embodiments of the N-latch driver circuit and isolation switch driver circuit can also be used in other DRAM devices and other memory devices, such as SRAM devices, FLASH memory devices, etc.

The operation of the SDRAM 200 is controlled by a command decoder 204 responsive to high-level command signals received on a control bus 206. These high level command signals, which are typically generated by a memory controller (not shown in FIG. 8), are a clock enable signal CKE*, a clock signal CLK, a chip select signal CS*, a write enable signal WE*, a row address strobe signal RAS*, a column address strobe signal CAS*, and a data mask signal DQM, in which the "*" designates the signal as active low. The command decoder 204 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these command signals will be omitted.

The SDRAM 200 includes an address register 212 that receives row addresses and column addresses through an address bus 214. The address bus 214 is generally coupled to a memory controller (not shown in FIG. 8). A row address is generally first received by the address register 212 and applied to a row address multiplexer 218. The row address multiplexer 218 couples the row address to a number of components associated with either of two memory banks 220, 222 depending upon the state of a bank address bit forming part of the row address. Associated with each of the memory banks 220, 222 is a respective row address latch 226, which stores the row address, and a row decoder 228, which decodes the row address and applies corresponding signals to one of the arrays 220 or 222. The row address multiplexer 218 also couples row addresses to the row address latches 226 for the purpose of refreshing the memory cells in the arrays 220, 222. The row addresses are generated for refresh purposes by a refresh counter 230, which is controlled by a refresh controller 232. The refresh controller 232 is, in turn, controlled by the command decoder 204.

After the row address has been applied to the address register 212 and stored in one of the row address latches 226, a column address is applied to the address register 212. The address register 212 couples the column address to a column address latch 240. Depending on the operating mode of the SDRAM 200, the column address is either coupled through a burst counter 242 to a column address buffer 244, or to the burst counter 242, which applies a sequence of column addresses to the column address buffer 244 starting at the column address output by the address register 212. In either case, the column address buffer 244 applies a column address to a column decoder 248.

Data to be read from one of the arrays 220, 222 is coupled to column circuitry 250, 252 (i.e., sense amplifiers, I/O gating, DQM & WPB mask logic, block write col/byte mask logic) for one of the arrays 220, 222, respectively. The column circuitry 250, 252 may further include the N-latch driver circuit 253, which is coupled to at least one sense amplifier in the column circuitry 250, 252. Additionally, the isolation switch driver circuit 255 may also be included as well. The data bits developed by the sense amplifiers are then coupled to a data output register 256. Data to be written to one of the arrays 220, 222 are coupled from the data bus 258 through a data input register 260. The write data are coupled to the column circuitry 250, 252 where they are transferred to one of the arrays 220, 222, respectively. A mask register 264 responds to a data mask DM signal to selectively alter the flow of data into and out of the column circuitry 250, 252, such as by selectively masking data to be read from the arrays 220, 222.

Figure 9:
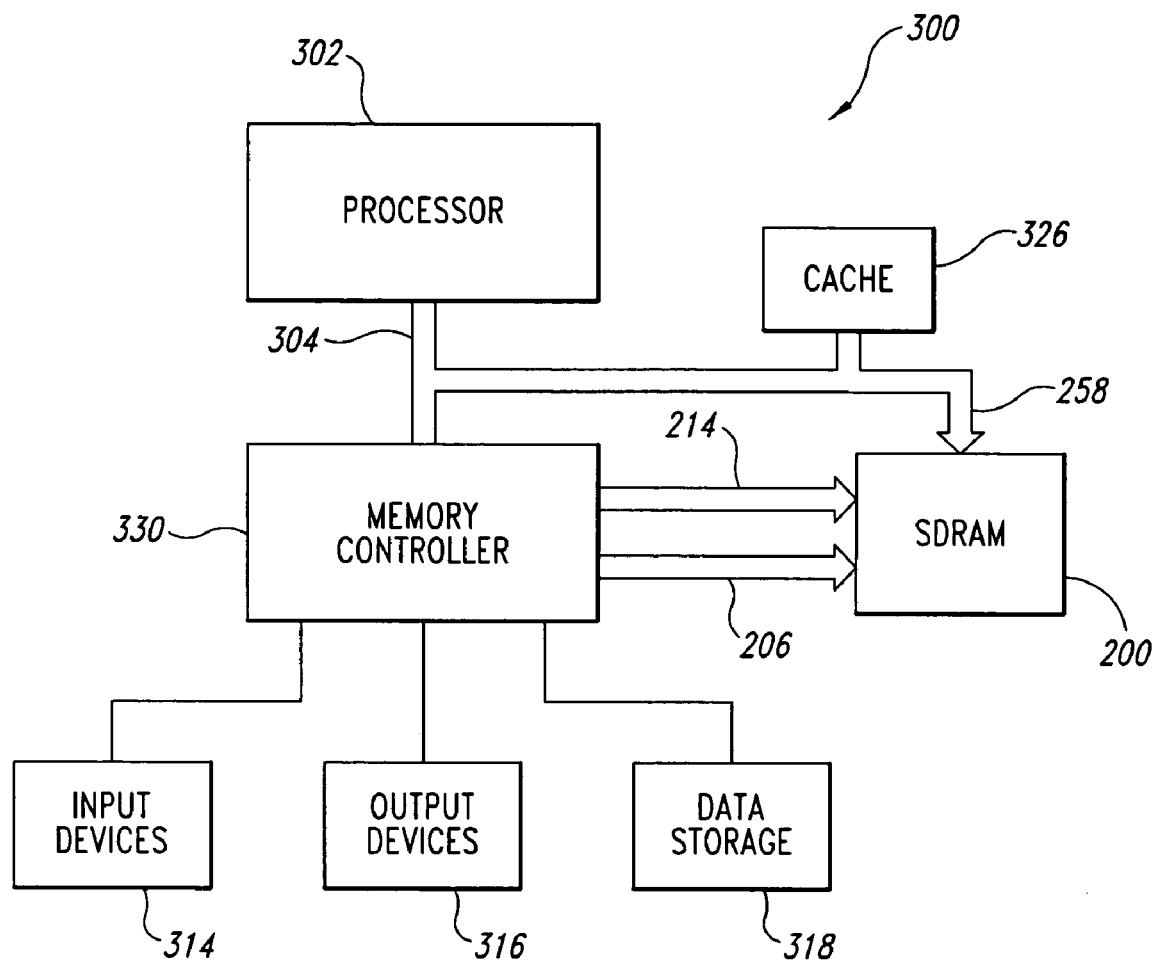
FIG. 9 is a block diagram of a processor-based system having the memory device of FIG. 8.

FIG. 9 shows an embodiment of a processor-based system 300 that may use the SDRAM 200 or some other memory device that uses the sense amplifier 100 or some other embodiment of the invention. The processor-based system 300 includes a processor 302 for performing various computing functions, such as executing specific software to perform specific calculations or tasks. The processor 302 includes a processor bus 304 that normally includes an address bus, a control bus, and a data bus. In addition, the processor-based system 300 includes one or more input devices 314, such as a keyboard or a mouse, coupled to the processor 302 to allow an operator to interface with the processor-based system 300. Typically, the processor-based system 300 also includes one or more output devices 316 coupled to the processor 302, such output devices typically being a printer or a video terminal. One or more data storage devices 318 are also typically coupled to the processor 302 to store data or retrieve data from external storage media (not shown). Examples of typical storage devices 318 include hard and floppy disks, tape cassettes, and compact disk read-only memories (CD-ROMs). The processor 302 is also typically coupled to a cache memory 326, which is usually static random access memory ("SRAM") and to the SDRAM 200 through a memory controller 330. The memory controller 330 includes an address bus 214 to couple row addresses and column addresses to the DRAM 200. The memory controller 330 also includes a control bus that couples command signals to a control bus 206 of the SDRAM 200. The external data bus 258 of the SDRAM 200 is coupled to the data bus of the processor 302, either directly or through the memory controller 330.

From the foregoing it will be appreciated that, although specific embodiments of the invention have been described herein for purposes of illustration, various modifications may be made without deviating from the spirit and scope of the invention. For example, embodiments of the invention have been described with reference to an open digit line configuration. However, embodiments of the present invention can be utilized in alternative digit line configurations, such as a folded digit line architecture. Accordingly, the invention is not limited except as by the appended claims.

What is claimed is:

1. A sense amplifier circuit, comprising:
   a latch circuit coupled to a digit line and configured to latch a data state coupled to the digit line and further configured to generate differential data signals in response to the data state, the differential data signals having first and second voltages;
   a first voltage supply circuit coupled to the latch circuit and configured to provide a positive voltage as the first voltage; and
   a second voltage supply circuit coupled to the latch circuit and configured to provide a negative voltage as the second voltage.

2. The sense amplifier circuit of claim 1 wherein the latch circuit comprises:
   first and second cross-coupled inverters.

3. The sense amplifier circuit of claim 1 wherein the latch circuit comprises:
an NMOS latch coupled to the second voltage supply.

4. The sense amplifier circuit of claim 1 wherein the second voltage supply circuit comprises:
a negative voltage supply configured to provide the negative voltage;
a ground reference; and
a switching circuit coupled to the negative voltage supply and the ground reference and configured to couple the negative voltage supply to the latch during a first time period and, during a second time period subsequent to the first time period, decouple the latch from the negative voltage supply and couple the ground reference to the latch.

5. The sense amplifier circuit of claim 1 wherein the first voltage supply circuit includes a device power supply.

6. The sense amplifier circuit of claim 1 wherein the latch circuit is further coupled to a complementary digit line, and the digit line and the complementary digit lines are associated with two different memory arrays.

7. The sense amplifier circuit of claim 1, further comprising:
a coupling circuit electrically coupled between the digit line and the latch circuit and configured to couple the digit line to the latch circuit responsive a control signal; and
a control circuit coupled to the coupling circuit and configured to generate the control signal to couple the digit line to the latch circuit and decouple the digit line and the latch circuit during a first phase and further configured to generate the control signal to couple the digit line to the latch circuit during a second phase subsequent to the first phase, the digit line and the node coupled at a controlled rate during the second phase.

8. The sense amplifier of claim 7 wherein the second voltage supply circuit comprises a supply circuit configured to provide a negative voltage as the second voltage following the first phase and prior to the second phase, the supply circuit further configured to provide a ground reference as the second voltage during the second phase.

9. The sense amplifier circuit of claim 1 wherein the first voltage supply circuit comprises a voltage supply configured to provide a positive voltage greater than a device supply voltage.

10. A sense amplifier circuit, comprising:
a latch circuit having a node and configured to latch a data state coupled to the node and further configured to generate differential data signals in response to the data state;
a coupling circuit coupled to the node of the latch and to a digit line to which data states are coupled, the coupling circuit configured to couple the digit line to the node of the latch responsive a control signal; and
a control circuit coupled to the coupling circuit and configured to control the coupling circuit to couple the digit line to the node and decouple the digit line and the node during a first phase and further configured to control the coupling circuit to couple the digit line to the node during a second phase subsequent to the first phase, the digit line and the node coupled at a controlled rate during the second phase.

11. The sense amplifier circuit of claim 10 wherein the control circuit comprises a control circuit configured to generate a control signal for the coupling circuit, the control circuit comprising:
a first switch coupled to a first voltage supply and configured to couple an output node at which the control signal is provided to the first voltage supply during the first phase and for a portion of the second phase;
a second switch coupled to a second voltage supply and configured to couple the output node to the second voltage supply for another portion of the second phase; and
a third switch coupled to ground and configured to couple the output node to ground between the first and second phases.

12. The sense amplifier circuit of claim 10 wherein the control circuit comprises a control circuit configured to generate a control signal to control the coupling circuit, the control signal generated by the control circuit during the second phase increasing in voltage to an intermediate voltage at a first rate and further increasing in voltage to a second voltage at a second rate.

13. The sense amplifier circuit of claim 10 wherein the control circuit comprises a control circuit configured to control the coupling circuit to couple the digit line to the node during the second phase over a time period greater than the time period over which the digit line is decoupled from the node during the first time period.

14. The sense amplifier circuit of claim 10 wherein the latch circuit comprises:
first and second cross coupled inverters.

15. The sense amplifier circuit of claim 10, further comprising:
a first voltage supply circuit coupled to the latch circuit and configured to provide a positive voltage as a first voltage; and
a second voltage supply circuit coupled to the latch circuit and configured to provide a negative voltage as a second voltage.

16. The sense amplifier circuit of claim 15 wherein the second voltage supply circuit comprises:
a negative voltage supply configured to provide the negative voltage;
a ground reference; and
a switching circuit coupled to the negative voltage supply and the ground reference and configured to couple the negative voltage supply to the latch between the first and second phases and configured to couple the ground reference to the latch during the second phase.

17. The sense amplifier circuit of claim 15 wherein the latch circuit comprises:
an NMOS latch coupled to the second voltage supply.

18. A sense amplifier circuit, comprising:
a latch circuit coupled to a digit line and configured to latch a data state coupled to the digit line and further configured to generate differential data signals in response to the data state, the differential data signals having first and second voltages;
a first voltage supply circuit coupled to the latch circuit and configured to provide a voltage greater than a device supply voltage as the first voltage; and
a second voltage supply circuit coupled to the latch circuit and configured to provide the second voltage.

19. The sense amplifier circuit of claim 18 wherein the latch circuit comprises:
first and second cross-coupled inverters.

20. The sense amplifier circuit of claim 18 wherein the latch circuit comprises:
a PMOS latch coupled to the first voltage supply.

21. The sense amplifier circuit of claim 18 wherein the second voltage supply circuit comprises:

a negative voltage supply configured to provide the negative voltage;

a ground reference; and a switching circuit coupled to the negative voltage supply and the ground reference and configured to couple the negative voltage supply to the latch during a first time period and, during a second time period subsequent to the first time period, decouple the latch from the negative voltage supply and couple the ground reference to the latch.

22. The sense amplifier circuit of claim 18 wherein the latch circuit is further coupled to a complementary digit line, and the digit line and the complementary digit lines are associated with two different memory arrays.

23. The sense amplifier circuit of claim 18, further comprising:

a coupling circuit electrically coupled between the digit line and the latch circuit and configured to couple the digit line to the latch circuit responsive a control signal; and a control circuit coupled to the coupling circuit and configured to generate the control signal to couple the digit line to the latch circuit and decouple the digit line and the latch circuit during a first phase and further configured to generate the control signal to couple the digit line to the latch circuit during a second phase subsequent to the first phase, the digit line and the node coupled at a controlled rate during the second phase.

24. The sense amplifier of claim 23 wherein the second voltage supply circuit comprises a supply circuit configured to provide a negative voltage as the second voltage following the first phase and prior to the second phase, the supply circuit further configured to provide a ground reference as the second voltage during the second phase.

25. The sense amplifier circuit of claim 18 wherein the second voltage supply is configured to provide a negative voltage as the second voltage.

26. A method of sensing a data state coupled to a digit line, comprising:

coupling the digit line to a sense node;

providing a negative voltage; and latching the data state in response to the negative voltage.

27. The method of claim 26 wherein providing the negative voltage comprises:

providing the negative voltage for a first time period; and switching the negative voltage to a ground reference level following the first time period.

28. The method of claim 27, further comprising:

decoupling the digit line during at least the first time period; and recoupling the digit line following the first time period.

29. The method of claim 28 wherein recoupling the digit line comprises:

recoupling the digit line to the sense node at a controlled rate.

30. The method of claim 29 wherein recoupling the digit line at a controlled rate comprises:

coupling the digit line to the sense node at a first rate; and coupling the digit line to the sense node at a second rate following the first rate.

31. The method of claim 30 wherein coupling the digit line to the sense node at the first rate comprises:

coupling the digit line to the sense node at the first rate until an intermediate voltage.

32. A method of coupling a digit line to a sense amplifier, comprising:

coupling the digit line to the sense amplifier for a first time period;

decoupling the digit line from the sense amplifier for a second time period; and coupling the digit line to the sense amplifier at a controlled rate.

33. The method of claim 32, further comprising sensing data coupled to the digit line and latching the data.

34. The method of claim 33 wherein sensing of the data occurs prior to decoupling the digit line and latching the data occurs prior to coupling the digit line.

35. The method of claim 33 wherein latching the data comprises providing a negative voltage and latching the data in response to the negative voltage.

36. The method of claim 35 wherein providing the negative voltage comprises providing a negative voltage until the digit line is decoupled from the sense amplifier and providing a ground reference level thereafter.

37. The method of claim 32 wherein coupling the digit line to the sense amplifier at a controlled rate comprises coupling the digit line to the sense amplifier at a first rate and coupling the digit line to the sense amplifier at a second rate following the first rate.

\* \* \* \* \*